United States Patent [19]
Edwards et al.

[11] Patent Number: 5,819,402
[45] Date of Patent: Oct. 13, 1998

[54] METHOD FOR COOLING OF CHIPS USING BLIND HOLES WITH CUSTOMIZED DEPTH

[75] Inventors: David Linn Edwards; Mark Gerard Courtney, both of Poughkeepsie, N.Y.; Albert Joseph Fahey, Pasadena, Calif.; Gregory Scott Hopper, Fishkill, N.Y.; Sushumna Iruvanti, Wappingers Falls, N.Y.; Charles Frederick Jones, Poughkeepsie, N.Y.; Gaetano Paolo Messina; Raed A. Sherif, both of Hopewell Junction, N.Y.

[73] Assignee: International Business Machines Corporation, Armonk, N.Y.

[21] Appl. No.: 868,541

[22] Filed: Jun. 4, 1997

Related U.S. Application Data

[63] Continuation of Ser. No. 727,098, Oct. 8, 1996, abandoned, which is a continuation of Ser. No. 460,291, Jun. 2, 1995, abandoned, which is a division of Ser. No. 349,231, Dec. 5, 1994.

[51] Int. Cl.$^6$ ...................................................... H05K 3/34
[52] U.S. Cl. .............................. 29/840; 29/832; 257/704; 257/705; 257/717; 257/718; 165/80.2; 165/80.3
[58] Field of Search ..................... 29/832, 840; 257/704, 257/705, 717, 718; 165/80.2, 80.3

[56] References Cited

U.S. PATENT DOCUMENTS

| | | |
|---|---|---|
| 4,092,697 | 5/1978 | Spaight . |
| 4,233,645 | 11/1980 | Balderes et al. . |
| 4,849,856 | 7/1989 | Funari et al. . |
| 4,939,570 | 7/1990 | Bickford et al. . |
| 4,999,699 | 3/1991 | Christie et al. . |
| 5,023,695 | 6/1991 | Umezawa et al. . |
| 5,249,101 | 9/1993 | Frey et al. . |
| 5,325,265 | 6/1994 | Turlik et al. . |
| 5,369,552 | 11/1994 | Barnes et al. . |
| 5,396,403 | 3/1995 | Patel . |

OTHER PUBLICATIONS

Research Disclosure, Oct. 1986, No. 270, No. 27014 Stick–on Heat Sink.
IBM Technical Disclosure Bulletin vol. 21, No. 2, Jul. 1978 pp. 752–753.
IBM Technical Disclosure Bulletin vol. 31, No. 12, May 1989 pp. 5–7.
IBM Technical Disclosure Bulletin vol. 32, No. 8A, Jan. 1990 pp. 168–170.
IBM Technical Disclosure Bulletin, vol. 33 No. 1A Jun. 1990 pp. 293–295.
IBM Technical Disclosure Bulletin, vol. 33 No. 1B Jun. 1990 p. 373.
IBM Technical Disclosure Bulletin, vol. 22, No. 3, Aug. 1979 p. 958.
IBM Technical Disclosure Bulletin, vol. 21 No. 6 Nov. 1978 p. 2441.
Research Disclosure, No. 270, Pub. No. 27014, Oct. 1986, "Stick–On Heat Sink".
Research Disclosure, No. 312, No. 31293, Apr. 1990, "Controlled Collapse Thermal Joint Between Chip and Heat Sink".
Research Disclosure, No. 322, Pub. No. 32262, Feb. 1991, "TCM Thermal Reticle".
Research Disclosure, No. 323, Pub. No. 32364, Mar. 1991, "Clog–Resistant Jet Impringement Flow Balancing Device".
Research Disclosure, No. 326, Pub. No. 32677, Jun. 1991, "TCM Hat Customization".

(List continued on next page.)

*Primary Examiner*—Carl J. Arbes
*Attorney, Agent, or Firm*—Aziz M. Ahsan

[57] ABSTRACT

The present invention relates generally to a new apparatus and method for customized cooling of chips. More particularly, the invention encompasses an apparatus and a method that provides customized cooling of a MCM (Multi-Chip Module) by varying the depth of thermal compound filled gap or the blind hole that is above each chip.

16 Claims, 2 Drawing Sheets

OTHER PUBLICATIONS

IBM Technical Disclosure Bulletin, vol. 21, No. 2, Jul. 1978, "Conduction Cooling".

IBM Technical Disclosure Bulletin, vol. 31, No. 12, May 1989, "Circuit Module Cooling with Multiple Pistons Contacting a Heat Spreader/Electrical Buffer Plate in Contact with Chip".

IBM Technical Disclosure Bulletin, vol. 32, No. 8A, Jan. 1990, "Buffered Immersion Cooling with Buckling Bellows Providing Barrier Between Chip and System Coolant and Pressure".

IBM Technical Disclosure Bulletin, vol. 33, No. 1A, Jun. 1990, "Fault–Tolerant Immersion Cooling".

METHOD FOR COOLING OF CHIPS USING BLIND HOLES WITH CUSTOMIZED DEPTH

CROSS-REFERENCE

This Patent Application is a Continuation Patent Application of U.S. patent application Ser. No. 08/727,098, filed on Oct. 8, 1996 abandoned, which was a Continuation Patent Application of U.S. patent application Ser. No. 08/460,291, filed on Jun. 2, 1995 abandoned, which was a Divisional Patent Application of U.S. patent application Ser. No. 08/349,231, filed on Dec. 5, 1994.

This Patent Application is related to U.S. patent application Ser. No. 08/349,232, entitled "METHOD AND APPARATUS FOR COOLING OF CHIPS USING A PLURALITY OF CUSTOMIZED THERMALLY CONDUCTIVE MATERIALS", assigned to the assignee of the instant Patent Application, which was filed concurrently, and the disclosure of which is incorporated herein by reference.

FIELD OF THE INVENTION

The present invention relates generally to a new apparatus and method for customized cooling of chips. More particularly, the invention encompasses an apparatus and a method that provides customized cooling of a MCM (Multi-Chip Module) by varying the depth of thermal compound filled gap or the blind hole that is above each chip.

BACKGROUND OF THE INVENTION

Semiconductor devices are becoming smaller and more dense with the evolution of new technology. However, increases in circuit density produce a corresponding increase in overall chip packaging strategies in order to remain competitive. Chip and chip carrier manufacturers are therefore constantly being challenged to improve the quality of their products by identifying and eliminating problems, reducing package size and weight, decreasing package costs, providing improved thermal efficiencies and by producing better and more advanced chips. Whereas significant improvements are being made to eliminate systematic problems by reducing process variability. Process improvements alone are not sufficient to eliminate all the problems which effect both performance and reliability.

One way to increase performance and reliability is to provide the shortest and most efficient thermal cooling path for the integrated circuit chips. This could be done by bringing the chip physically as close as possible to the heat sink. Another way would be to provide more efficient cooling of the chip. However, when the chips are brought closer to the heat sink, means also have to be provided to securely provide a thermal contact between the chip and the heat sink. In some cases highly thermally conductive epoxies have been used to provide a better thermal contact between the chip and the heat sink. However, this would create a problem if different types of chips are present on the MCM, because some chips may be "under cooled" while others may be "over cooled".

The introduction of MCMs has helped packages perform better electrically, but at the same time it has made them more difficult to cool. Moving chips from single chip modules (SCMs) to MCMs greatly affects the module heat flux density, even when chip flux densities are unchanged. The cooling of large MCMs has been the subject of many inventions, such as, for example, the use of pistons to cool the chips, and most recently FPC (flat plate cooling). While the previous approaches used tight tolerance mechanisms to provide a thermal/mechanical path for the heat to flow from the chip to the cooling fluid (air or water).

Flat plate cooling uses much fewer parts, and it uses a thermal compound to provide the cooling path between the chip and the flat plate. In general, the concept of FPC is to install a flat thermally conductive "hat" just above, and parallel to the chip back side surfaces. The gap between the chips and the hat is typically filled with a thermally conductive material. The thermally conductive material (thermal compound, grease or paste) is installed in specific locations with sufficient quantity so that the back side of each chip is entirely covered. Although the compliant thermally conductive material has a thermal conductivity much lower than the metals used in previous inventions, it is able to provide better thermal performance at a lower cost because the thickness of the paste filled gap is small, there are fewer interfaces for the heat to cross, and it is insensitive to chip pitch.

A typical application of FPC would be to have an array of chips on a substrate, where each had the same size and height, cooled by FPC. In this application, each chip would have the same thermal resistance to the cooling hat.

One example of flat plate cooling is Umezawa, et al., U.S. Pat. No. 5,023,695, where a heat conducting compound is present between the chips and the flat cooling plate.

Research Disclosure, No. 270, Publication No. 27014 (October 1986), the disclosure of which is incorporated herein by reference, discloses a stick-on heat sink. A heat sink is attached to a module by sliding the module into the heat sink and where the edges of the heat sink snap close to secure the heat sink to the module. It is also disclosed that an adhesive or double sided tape could also be placed on the bottom surface of the heat sink to assure intimate contact between the module and the heat sink.

U.S. Pat. No. 4,092,697 (Spaight), the disclosure of which is incorporated herein by reference, discloses placing a film of thermally conductive material between the chip and the heat sink or heat radiator.

U.S. Pat. No. 4,233,645 (Balderes et al.), discloses placing a block of porous material which is impregnated with a suitable liquid between the chip and the heat sink to provide a thermally conductive path.

U.S. Pat. No. 4,849,856 (Funari et al.), the disclosure of which is incorporated herein by reference, discloses a direct chip to heat sink attachment process where a thermally conductive adhesive is used to directly secure the heat sink to the chip.

U.S. Pat. No. 4,939,570 (Bickford et al.), the disclosure of which is incorporated herein by reference, discloses another direct chip to heat sink attachment process where a thermally conductive adhesive is used to directly secure the heat sink to the chip.

U.S. Pat. No. 4,999,699 (Christie, et al.), the disclosure of which is incorporated herein by reference, discloses solder interconnection whereby the gap created by solder connections between a carrier substrate and semiconductor device is filled with a composition obtained from curing a preparation containing a cycloaliphatic polyepoxide and/or curable cyanate ester or prepolymer thereof; filler having a maximum particle size of 31 microns and being at least substantially free of alpha particle emissions.

U.S. Pat. No. 5,249,101 (Frey, et al.), the disclosure of which is incorporated herein by reference, discloses a coverless chip carrier which uses at least two encapsulants. The first encapsulant is used to provide flip-chip fatigue life enhancement. The second encapsulant is used to provide limited environmental protection. A third encapsulant is also required for carriers using peripheral leads to contain the second encapsulant prior to curing. Also disclosed is that the encapsulant have a CTE (Coefficient of Thermal Expansion) which is within 30 percent of the CTE of the solder balls.

U.S. Pat. No. 5,325,265 (Turlik, et al.) discloses that cushions could provide a thermally conductive path between an exposed back face of a chip and a heat sink. Also disclosed is the fact that a solder preform may be used for the cushions with the preforms being held in place using grooves or cavities or a combination thereof.

The inventors of this invention, however, are using an entirely different approach to solve this age old problem. They are customizing the thermal cooling by varying the depth of the gap or the blind hole which is above the semiconductor element and is filled with the thermal compound.

Furthermore, the structure and process of this invention offers several advantages over the prior art. For example, it provides a simplified modular construction, which has been customized to accommodate individual chips, and therefore it allows ease of workability or repair of the assembled multi-chip module.

PURPOSES AND SUMMARY OF THE INVENTION

This invention is a novel method and an apparatus for providing customized cooling by varying the depth of the gap or the blind hole that is filled with the thermal compound. This becomes especially important for MCM where there are customized or different chips on the module or substrate or chip carrier.

Therefore, one purpose of this invention is to provide an apparatus and a method that will provide a direct thermal path to the heat sink or cap.

Another purpose of this invention is to provide customized cooling to individual chips on a module or substrate, and to ensure a secure thermal contact between the substrate and the heat sink or cap.

Still another purpose of this invention is to have a very economical and efficient thermally conductive path between a chip and a heat sink.

Yet another purpose of this invention is to increase the available area on the substrate or the chip carrier for device joining, for example, active devices, such as, chips, or passive devices, such as, capacitors, etc.

Still yet another purpose of the invention is to provide a method and apparatus for ensuring the bond integrity between the substrate and the heat sink.

Yet another purpose of this invention is the ability to rework or repair the completed or assembled module.

Therefore, in one aspect this invention comprises an apparatus to provide a customized thermally conductive path between at least two chips and a thermal cap, wherein said thermal cap has at least two thermal contact areas, wherein each of said thermal contact areas correspond to each of said chips and wherein the thermal conductive path between at least two of said chips to said thermal cap is different.

In another aspect this invention comprises a method to provide a customized thermally conductive path between at least two chips and a thermal cap, comprising the steps of:
(a) securing said at least two chips onto a substrate,
(b) placing said thermal cap over said substrate, wherein said thermal cap has at least two thermal contact areas, wherein each of said thermal contact areas correspond to each of said chips, and wherein the thermal conductive path between at least two of said chips to said thermal cap is different.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
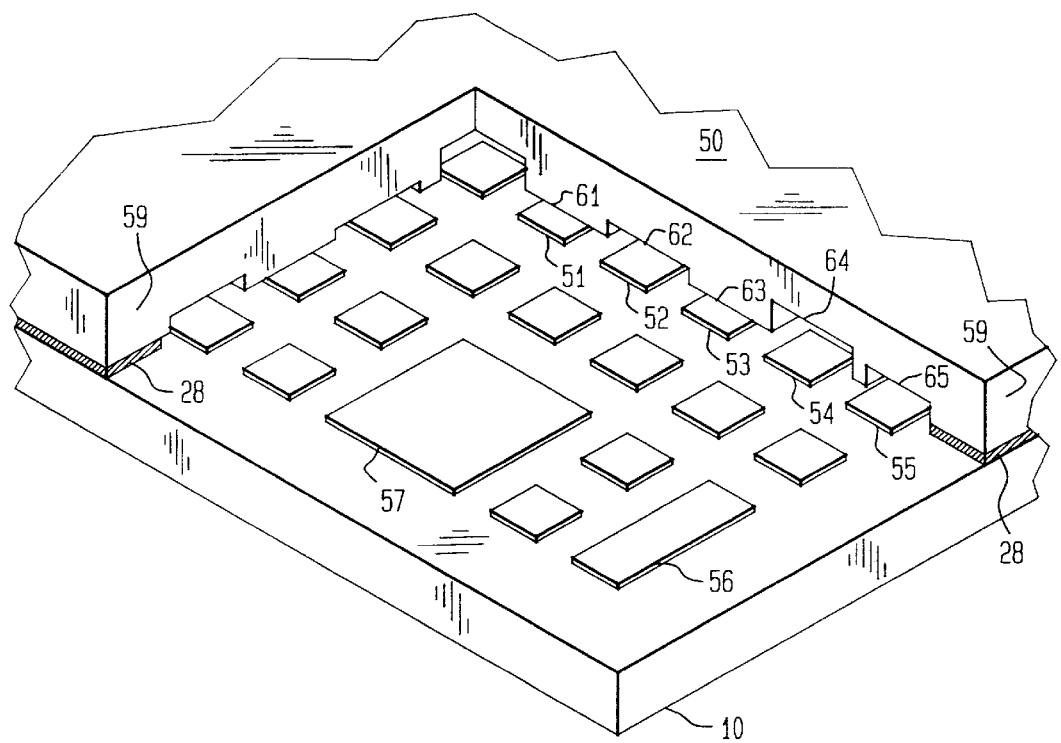
FIG. 1, illustrates one preferred embodiment of this invention.

IBM's multilayered ceramic (MLC) electronic packages are among the most technically advanced electronic packages in the industry. This invention describes one way to reduce cost of such packages with an increase in the performance. Packaging methods which reduce cost advantageously increase the availability of such electronic packages in the marketplace. As a person skilled in the art knows that increased packaging density is typically achieved by optimum utilization of the real estate of the substrate or module or chip carrier.

It is also well known that chip temperatures impact device function, speed, and reliability. Therefore, it is important to have all the chips in a module operate inside a relatively narrow temperature window for best module performance. This window is set by the electrical engineer, early in the design process. It is the responsibility of the thermal engineer to design the cooling in such a way that makes all the chips operate within this temperature window at all times.

A multi-chip module that is designed to provide sufficient cooling to the most challenging chip in the module will often have much more cooling than is required at less challenging chip sites, causing them to be "overcooled". If this is not taken into account then some of the other chips could be running "cooler" while others could be running "hotter". Therefore, for a MCM having a variety of chips, unless the cooling is customized, some of the chips would operate at temperatures below or above their functional specification, unless chip power is reduced or is increased, or the specification temperature range is increased or reduced, or both.

It is not an easy task to make sure that all the chips operate within this relatively narrow temperature windows. The difficulty stems from the fact that chip operating temperatures are a function of many factors, including chip power, chip size, package design, placement within the package, and proximity of other chips. The primary driver is chip power. The chips within an MCM typically have a range of nominal powers, and their actual powers can vary significantly from their nominal power dissipation. Statistical variations in chip power (which is typically on the order of ±30 percent) makes chip cooling customization more complicated as the thermal engineer must allow for this variation, and make sure that the window is met for the highest power chip, the lowest power chip, and the rest of the chips on the module. There are location and statistical variations associated with the cooling design itself. All this has to be taken into account in order to ensure that each chip will operate within the specified temperature window at all times.

It was determined by the inventors that the chip temperature rise over the temperature of the cooling hat is approximately proportional to the product of the chip power by the thermal resistance of the compound between the chip and the module or thermal cap. Mathematically, it is expressed as $$\Delta T \text{ is } \sim \propto \text{ to } P_{chip} \times \left(\frac{L}{kA}\right) \quad (1)$$

where, T is temperature,

P is power,

L is the depth of the gap between the chip and the module cap, k is the thermal conductivity of the compound between chip and the cap, and A is the chip area.

Therefore, the inventors have found that the chip temperatures could be adjusted by varying L, to vary the Delta T. The inventors discovered that this L could be varied by drilling blind holes in the thermal cap right above the chip where the chip temperature needs to be increased. These blind holes can be of any shape, such as, for example, circular, rectangular, triangular, polygonal, to name a few. The depth of the cut depends on how much the chip temperature needs to be increased.

However, the results given by the above mentioned equation do not take into account how the power and/or temperature of one chip (or a group of chips) can impact the hat or thermal cap temperature, and therefore in turn the temperatures of other chips. This interaction between chips is due mainly to the heat spreading in the module cap (which is typically made of a good heat-conducting material) and can be accounted for in a three dimensional scheme. In the process of customization, the thermal engineer should use this type of scheme to account for the locations and powers of the chips inside the module.

FIG. 1, illustrates one inventive scheme for cooling chips on an MCM. As illustrated in FIG. 1, a plurality of semiconductor elements, such as, chips 51, 52, 53, 54 and 55 are secured to a substrate or module 10, via a plurality of solder connections 22, as more clearly shown in FIG. 3, such as, for example, C4 (Control Collapse Chip Connection), solder balls, solder column connection (SCC) or ball grid arrays (BGA) 22.

The substrate 10, could also have one or more electronic device(s), (not shown), such as, for example, decoupling capacitors, that are also electrically connected to the substrate 10, via solder connections 22. For some applications the solder balls 22, could be protected with one or more partial encapsulants (not shown), which encapsulants are well known in the art.

Thermally conductive materials, such as, thermal compounds or thermal greases or thermal pastes are applied over the exposed surface or back-side of the chips, such that a direct thermal contact is made between the chips, and the roof or thermal contact area, of the cap or cover or heat sink 50, when the cover 50, is placed over to cover and/or protect the chips.

The cap or cover 50, typically has an extension or ledge or wall 59, that provides the mechanical connection between the substrate 10, and the heat sink 50, which connection is well known in the art, for example, the extension 59, could be secured to the substrate 10, using solder or some sort of an adhesive 28. The substrate 10, typically has electrical connection means or I/O (Input/Output) means 12, such as, for example, pads, pins, solder connections, etc., to name a few.

The cap or cover 50, is typically a metallic or ceramic cap, that is placed over the chips, and is properly secured to the peripheral edge surface of the substrate 10. This is done primarily to prevent mechanical and chemical injury to the chips, solder balls 22, decoupling capacitors, any encapsulant that may be present, and any exposed metallurgy or circuitry on the substrate or module 10. The thermal cap 50, is also provided to be a heat sink for the chips on the chip carrier or substrate 10. It is also well known that a leak in the cap 50, or any misalignment of the thermal cap 50, may result in irrecoverable module yield losses. These losses could be substantial for an expensive module. A picture-frame type area on the top surface of the substrate 10, is required to specifically seal the cap 50, to the substrate 10, using techniques well known in the art, such as, for example, a cap sealant, solder or adhesive 28, to name a few. For a typical MCM this frame type surface could be between about 2 mm and about 6 mm wide. Therefore, the placement of all devices, such as, for example, chips, decoupling capacitors, are restricted to be within this picture frame area, which is typically only between about 50 percent and about 70 percent, of the area that would otherwise be available for additional or larger devices. Additionally, the cap or cover 50, typically adds between about 30 percent and about 50 percent, to the overall height of the module. It should be noted that thermal compound, must be placed between the chips, and the cap 50, to provide a most efficient heat transfer path, to the cap or heat sink 50. It is to be understood that the presence of the thermal cap or cover 50, adds additional weight to the completed or assembled module. It should also be noted that care needs to be so taken that the heat sink 50, does not interfere with other electronic components that may be on or near the substrate 10.

Figure 2:
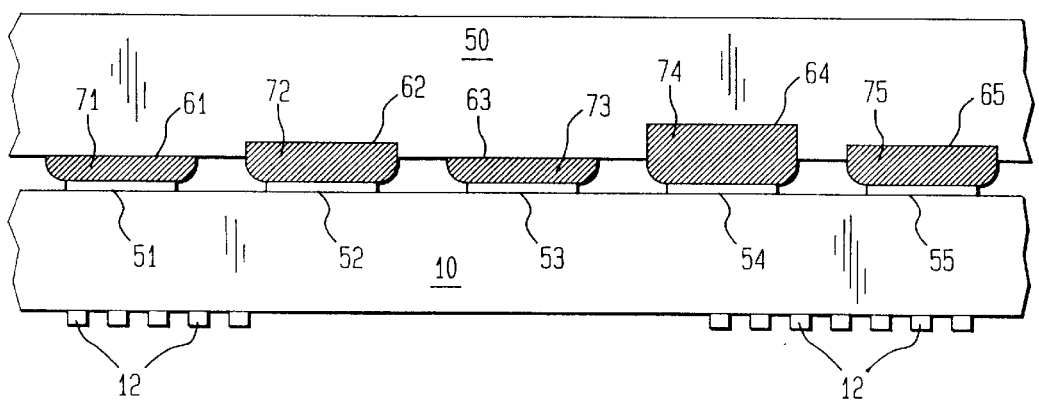
FIG. 2, illustrates a more detailed view of a cross-sectional area of the preferred embodiment of this invention.

FIG. 1, illustrates one preferred embodiment of this invention. While FIG. 2, illustrates a more detailed view of a cross-sectional area of the invention taken from FIG. 1. With the advancement of MCM (Multi-Chip Module) technology there is a desire to now place chips on a module where each of the chips could be different. These chips could be different for a number of reasons, such as, for example, in their size or in their power or in their performance, etc., and therefore their ability to generate or dissipate heat would normally be different. As illustrated in FIGS. 1, the chips or semiconductor elements 51, 52, 53, 54, 55, 56 and 57, are all somewhat different from each other, and so are their power requirements. Therefore, the heat sink or thermal cap 50, has to be customized to accommodate the thermal dissipation requirements for each of the different chips. The inventors of this invention have found a solution, such as, to customize thermal contact areas or locations 61, 62, 63, 64 and 65, which corresponds to the chips 51, 52, 53, 54 and 55, respectively. Similarly, the thermal contact areas for chips 56 and 57, will be different, depending upon the thermal requirements. An adhesive or a solder 28, is typically used to secure the peripheral ledge or extension 59, of the thermal cap 50, to the substrate 10. Other means well known in the art could also be used to secure the peripheral ledge 59, to the substrate 10.

As can be more clearly seen in FIG. 2, the customized thermal contact area 61, is closer to the chip 51, while the customized thermal contact area 62, is further away from the chip 52. Similarly, the customized thermal contact areas 64 and 65, are each different for their corresponding chips 54 and 55, respectively. While, the customized thermal contact area 63, provides heat transfer to the chip 53, which is the same as or similar the thermal contact area 61.

It can also be very clearly seen in FIG. 2, that the amount of thermal fluid, such as, for example, thermal oil, thermal paste, thermal grease, to name a few, that is present or required for each of the chips could be the same or could be different. As shown in FIG. 2, thermal paste 71, 72, 73, 74 and 75, provides a heat or thermal transfer path between the corresponding chips and the heat sink 50.

The thermal conducting paste that is between each chip and the customized thermal contact area could also be the same or it could be different pastes. For example, thermal paste 71, could be the same thermal paste as the thermal paste 74, while the thermal paste 71, could be different than the thermal paste 73.

Chips 51 and 53, have higher power, and therefore the thermal or heat transfer area 61 and 63, is so close that there is a minimum gap between the chips and the thermal cap or heat sink. Chips 52 and 55, have medium power, and therefore the heat transfer path or the gap between the chips 52 and 55, and the corresponding heat transfer area 62 and 65, respectively, has increased. Chip 54, has low power, and therefore it has a larger gap between the chip and the heat sink at the heat transfer area or location 64.

Figure 3:
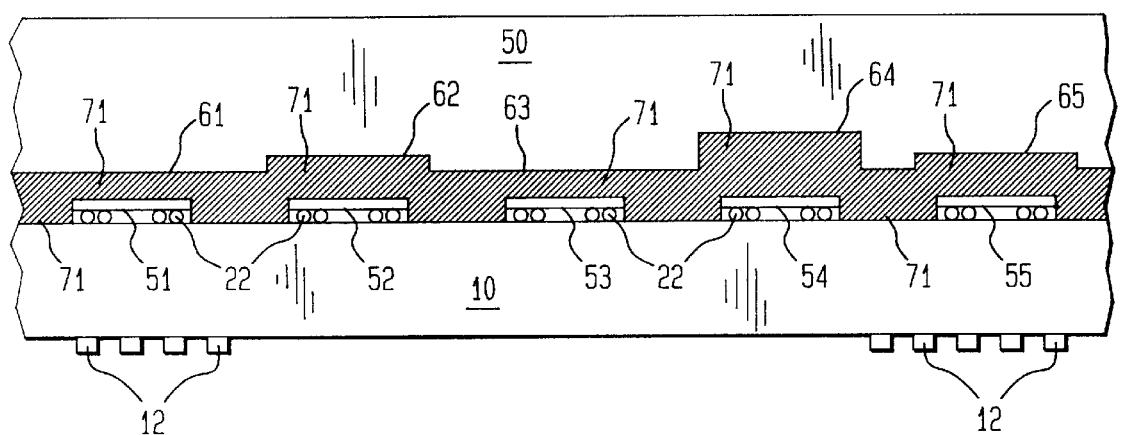
FIG. 3 illustrates a more detailed view of a cross-sectional area showing the entire area between the thermal cap and the substrate filled with at least one thermally conductive fluid.

FIG. 3, illustrates a more detailed view of a cross-sectional area showing the entire area between the thermal cap 50, and the substrate 10, including the customized blind holes 62, 64 and 65, filled with at least one thermally conductive fluid. As can be clearly seen that semiconductor elements 51, 52, 53, 54 and 55, with similar or different thermal requirements, are secured to the substrate o r module 10, via a plurality of solder connections 22. For the purposes of illustration only thermally conductive fluid 71, is shown. However, this entire area, including the blind holes 62, 64 and 65, could be filled with thermally conductive fluids 71, 72, 73, 74 and/or 75.

The optimum depth of the cut or gap is affected not only by chip power, but also by chip size, height, placement in the module, and neighboring chips. Optimum selection of gap thicknesses will achieve heating up chip temperatures only enough for them to just get in the application specification window, and will maximize module reliability. An option for cost reduction is to loosen the tolerances on the depth of the deeper holes (because larger gaps don't need to be as precise).

This invention provides cooling customization whether thermal compound is placed only on the back side of the chips, e.g., with thermal grease, etc., or thermal compound entirely fills the module, e.g. with oil, etc. In this manner, high power chips can have a small gap (for maximum thermal performance) and lower power chips have individualized larger gaps.

Using the apparatus and/or method of this invention all the chips on a MCM can now be sufficiently cooled within their specification windows, but not be overcooled or undercooled.

The advantages of an electronic package or module such as the one disclosed in this patent application are many. Such as, the cost of the package is reduced due to (a) fewer process steps to assemble the module, (b) the customization of the heat transfer area above and near the chip, etc.

Furthermore, this inventive structure provides a more efficient use of the substrate top surface area, because now we can have chips of different types populating the substrate top surface area and more space is now available for electronic components and other features. This packaging scheme also allows for a direct and a more efficient heat transfer path from the chip, thus improving the overall thermal performance of the multichip module.

Another advantage is the reworkability or repair of the module. The heat sink can be easily pulled-off from the substrate and the active devices, such as, a chip, or passive devices, such as, a decoupling capacitor, heat sink etc., or module in its entirety could be reworked or repaired. Furthermore, any circuits on the surface of the substrate could also be reworked or repaired after the heat sink has been removed. Of course, the heat sink can be reattached once the rework or repairs have been made.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method to provide a customized thermally conductive path between at least two semiconductor elements and a thermal cap, comprising the steps of (a) securing said at least two semiconductor elements onto a substrate, (b) placing said thermal cap over said substrate, wherein said thermal cap has at least two thermal contact areas, wherein at least one of said at least two thermal contact areas is a blind hole, and wherein each of said thermal contact areas correspond to each of said semiconductor elements, and wherein the thermal differential between at least two of said semiconductor elements to said thermal cap is different, and (c) placing at least one thermally conductive material between said at least two thermal contact areas and said at least two semiconductor elements, such that a portion of said thermally conductive material is inside said at least one blind hole and provides a direct thermal contact between said thermal contact area in said at least one blind hole and corresponding said at least one semiconductor element, and thereby providing said method to provide a customized thermally conductive path between at least two semiconductor elements and a thermal cap.

2. The method of claim 1, wherein at least one thermally conductive fluid is present between said at least two semiconductor elements and said corresponding thermal contact areas.

3. The method of claim 1, wherein at least one thermally conductive fluid is present between said at least two semiconductor elements and said corresponding thermal contact areas, and wherein said at least one thermally conductive fluid is selected from a group comprising thermal oil, thermal paste, thermal grease and thermal compound.

4. The method of claim 1, wherein there are at least two thermally conductive fluids present between said at least two semiconductor elements and said corresponding thermal contact areas, and wherein the thermal conductivity of said at least two thermally conductive fluids is different.

5. The method of claim 1, wherein at least a portion of at least one of said semiconductor elements is secured to said substrate using at least one first electrical connection.

6. The method of claim 5, wherein said at least one first electrical connection is selected from a group comprising C4, solder ball, solder column, low-melting point solder or high-melting point solder.

7. The method of claim 1, wherein said substrate has at least one additional electronic device secured thereto.

8. The method of claim 7, wherein said at least one additional electronic device is a decoupling capacitor.

9. The method of claim 1, wherein the entire area between said thermal cap and said substrate is filled with at least one thermally conductive fluid.

10. The method of claim 1, wherein the entire area between said thermal cap and said substrate is filled with at least one thermally conductive fluid, and wherein said at least one thermally conductive fluid is selected from a group consisting of thermal oil, thermal paste, thermal grease and thermal compound.

11. The method of claim 1, wherein at least a portion of said thermal cap is secured said substrate.

12. The method of claim 1, wherein at least a portion of said thermal cap is secured to said substrate by at least one means, and wherein said at least one means is selected from a group consisting of solder, adhesive and mechanical clamp.

13. The method of claim 1, wherein the heat generation of said at least two semiconductor elements is different.

14. The method of claim 1, wherein each of said thermal contact area is a blind hole.

15. The method of claim 14, wherein the shape of the walls of said blind hole is selected from a group comprising square shape, circular shape, triangular shape or a polygonal shape.

16. The method of claim 1, wherein the shape of the wall of said at least one blind hole is selected from a group comprising square shape, circular shape, triangular shape or a polygonal shape.

* * * * *